(12) United States Patent
Hu et al.

(10) Patent No.: US 6,342,733 B1
(45) Date of Patent: Jan. 29, 2002

(54) REDUCED ELECTROMIGRATION AND STRESSED INDUCED MIGRATION OF CU WIRES BY SURFACE COATING

(75) Inventors: Chao-Kun Hu, Somers; Robert Rosenberg, Cortlandt Manor; Judith Marie Rubino, Ossining; Carlos Juan Sambucetti, Croton-on-Hudson, all of NY (US); Anthony Kendall Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/361,573

(22) Filed: Jul. 27, 1999

(51) Int. Cl.$^7$ .................. H01L 23/522; H01L 23/532
(52) U.S. Cl. .................. 257/750; 257/752; 257/762
(58) Field of Search ................. 257/750, 752, 257/762, 763, 774

(56) References Cited

U.S. PATENT DOCUMENTS

| | | | |
|---|---|---|---|
| 5,627,345 A | 5/1997 | Yamamoto et al. | 174/265 |
| 5,681,779 A | 10/1997 | Pasch et al. | 437/198 |
| 5,693,563 A | * 12/1997 | Teong | 438/627 |
| 5,739,579 A | * 4/1998 | Chiang et al. | 257/635 |
| 5,834,369 A | 11/1998 | Murakami et al. | 438/648 |
| 5,892,286 A | 4/1999 | Toyoda et al. | 257/775 |
| 5,968,333 A | * 10/1999 | Nogami et al. | 205/184 |
| 6,136,707 A | * 10/2000 | Cohen | 438/687 |
| 6,174,812 B1 | * 1/2001 | Hsiung et al. | 438/687 |

FOREIGN PATENT DOCUMENTS

| | | | |
|---|---|---|---|
| EP | 06006012 | 1/1994 | H05K/3/24 |
| GB | 2184288 A | 6/1986 | H01L/21/44 |
| JP | 4-280627 | * 10/1992 | |

* cited by examiner

Primary Examiner—Allan R. Wilson
(74) Attorney, Agent, or Firm—Robert M. Trepp

(57) ABSTRACT

The idea of the invention is to coat the free surface of patterned Cu conducting lines in on-chip interconnections (BEOL) wiring by a 1–20 nm thick metal layer prior to deposition of the interlevel dielectric. This coating is sufficiently thin so as to obviate the need for additional planarization by polishing, while providing protection against oxidation and surface, or interface, diffusion of Cu which has been identified by the inventors as the leading contributor to metal line failure by electromigration and thermal stress voiding. Also, the metal layer increases the adhesion strength between the Cu and dielectric so as to further increase lifetime and facilitate process yield. The free surface is a direct result of the CMP (chemical mechanical polishing) in a damascene process or in a dry etching process by which Cu wiring is patterned. It is proposed that the metal capping layer be deposited by a selective process onto the Cu to minimize further processing. We have used electroless metal coatings, such as CoWP, CoSnP and Pd, to illustrate significant reliability benefits, although chemical vapor deposition (CVD) of metals or metal forming compounds can be employed.

11 Claims, 5 Drawing Sheets

REDUCED ELECTROMIGRATION AND STRESSED INDUCED MIGRATION OF CU WIRES BY SURFACE COATING

FIELD OF THE INVENTION

This invention relates to metal interconnections on semiconductor chips and more particularly to a surface coating or treatment to prevent surface atoms of conductors from being moved downstream by an electron current, a phenomena known as electromigration, and/or from being moved by a stress gradient tending to relax stress known as stress induced migration.

BACKGROUND OF THE INVENTION

Increased density and speed of microelectronic circuitry has caused a shift in the metallization system from Al(Cu) to Cu to reduce the resistance of the conductor. At the same time, the need for higher levels of current density has exposed the Al(Cu) lines to failure by electromigration, limiting the extent to which circuit designers can increase performance. The higher melting point of Cu is expected to improve the current carrying capability of the conductors, extending electromigration lifetime. However, from our test results, we have found that the electromigration lifetime is most dependent on the atomic behavior such as atomic transport at the Cu/dielectric interface and not on the intrinsic character of the Cu lattice, grain boundary or Cu/liner interface atom transport. Thus, the specifications for allowed current in Cu conductors proved not to be significantly superior to those for Al(Cu).

The basic process for fabricating Cu conductor patterns is by the damascene method where trenches are formed in a dielectric layer, a liner is formed in the trenches and then the trenches are filled with Cu and then chemical mechanical polished (CMP) which terminates in a clean top Cu surface coplanar with the dielectric layer. Cu/metal liner interfaces are formed on the other three surfaces of the Cu conductor. The electromigration lifetime is a function of the line thickness, width and cross section area. Data from measurements showed that only the top surface was contributing to mass transport for Cu conductors with bamboo-like and near bamboo grain structure and a combination of boundary and surface were contributing to mass transport for wider lines. The same relationship was found to be independent of the Cu deposition method, i.e., whether the deposition was by Physical Vapor Deposition (PVD), Chemical Vapor Deposition (CVD) or electroplating, illustrating the pervasiveness of the problem. In addition to electromigration lifetime failure, it was found that Cu conductor patterns are susceptible to atomic voiding under thermal cycle stress, with voids always found to be initiated at the Cu/dielectric interface where the atomic mobility is highest. Since the copper migration rate, drift velocity, is a product of mobility (D/kT) times driving force (F) where D is the diffusivity of Cu, T is the absolute temperature in Kelvin, k is the Boltzmann constant. The driving forces, F, are Z*eE and (Ds/Dx) W for electromigration and stress induced migration forces, respectively, where Z* is the effective charge number, e is the electronic charge, E is the electric field, (Ds/Dx) is the stress gradient, and W is the atomic volume. It is now inevitable that achievement of a Cu conductor technology with which the highest performance and reliability can be realized will require alteration or modification of the Cu/dielectric interface of an overlayer to reduce Cu transport and atomic voiding.

Modification of the Cu conductor surface can be done after CMP. Then, the process should be selective to Cu and provide a thin layer on the surface of the Cu conductor so as to remain substantially coplanar with the dielectric or insulation containing the trenches. The process must result in improved adhesion between the Cu conductor and the subsequently formed dielectric over layer and improved oxidation resistance of the Cu atoms in the Cu conductor, as well as reduced atomic transport of the Cu conductor, to provide maximum reliability.

SUMMARY OF THE INVENTION

In accordance with the present invention, the exposed Cu surface of a Cu conductor is altered by providing a thin metal layer in the range from 1 to 20 nm on the Cu surface, such as subsequent to a CMP planarization or a dry etching process, in order to reduce susceptibility to electromigration, oxidation, corrosion, stress voiding and delamination during subsequent chip processing and/or chip utilization, thus improving reliability and yield. This invention teaches the method of electroless metal deposition as one way to form a thin metal layer on a Cu conductor to increase electromigration lifetime and stress induced migration resistance.

The selective deposition process comprises the following steps.

a. Selective activation of the copper surface using a Pd ion catalyst which is shown in Equation 1.

$$Cu + Pd^{++} \text{---} áCu^{++} + Pd \tag{1}$$

This procedure leaves a multitude of Pd nanoparticles on the surface of the copper lines to act as a catalyst for the next step.

b. Selective deposition of a metal or alloy using electroless reduction which is shown in Equation 2.

$$\text{reducing agent} + Me^{n+} + Cu \text{---} áCu/Me + \text{oxidized form of reducing agent} \tag{2}$$

Where $Me^{n+}$ is a metal ion, for example, $Co^{2+}$.

For example, using hypophosphite as the reducing agent and cobalt ions as the capping metal, we have a chemical reaction as shown in Equation 3.

$$2H_2PO_2^- + Co^{2+} + H_2O \ldots ((\ldots Cu \ldots)) \text{---} áCo + 2HPO_3^{2-} + H_2 + 4H^+ \tag{3}$$

In the course of this invention we have used the hypophosphite (capping layer) system described above, and deposited onto the surface of the copper conductor the metal palladium, cobalt, cobalt-tungsten, cobalt-tungsten-phosphide, cobalt-tin, cobalt-tin-phosphide, colbalt phosphide and other alloys of cobalt. It is also understood that other reducing agents can be used, such as dimethylamino borane, which allows deposition of other types of alloys, such as Co—B or Ni—B.

As a result of steps a and b above, the exposed surface of the copper conductors are coated with a thin film preferably in the range from 1 to 10 nm thick of a metal compound or alloy which is strongly adhered via chemical and/or metalurgical bonds to copper atoms on or in the copper surface.

The following important findings are critical to this invention in a damascene process for making copper interconnects on integrated circuit chips.

1. The thickness of the coating film on the copper surface must be small: maximum 20 nm, and preferably between 1 and 10 nm due to damascene process considerations. In this way, at least three major properties are achieved: a) the resistivity of the Cu line is not affected or increased by more than 20%, b) the electrical leakage, which may occur due to bridging between Cu conductors, is eliminated and c) no further planarization of the Cu conductor or line is necessary. Planarization or substantial planarization of the Cu conductor/dielectric surface is required in order to provide a planarized top surface of a subsequently formed dielectric layer thereover without the need to planarized the top surface of the subsequent dielectric layer. Step features from one surface are translated through the next layer to the surface above especially when formed by CVD.

2. The preferred composition of the coating films may be Co—Sn—P, Co—W—P, Co—P or Pd.

3. The wafers with coated films were annealed at 300° C. for two (2) hours to further improve the chemical or metalurgical bonding to the copper surface and slow down diffusion of the copper atoms along the Cu surface at the Cu conductor/dielectric interface and along grain boundaries. The Cu conductor/dielectric interface is between the Cu conductor and the dielectric layer formed over the Cu conductor. The Cu conductor in a damascene process is in a trench in a dielectric layer with a metal liner formed in the trench prior to filling with the Cu conductor.

4. Also, selective CVD of metals, or other deposition processes may be used to deposit a metal film on the surface of the Cu conductor with chemical and/or metalurgical bonding to achieve increased electromigration resistance of the Cu conductor.

BRIEF DESCRIPTION OF DRAWING

These and other features, objects, and advantages of the present invention will become at apparent upon consideration of the following detailed description of the invention when read in conjunction with the drawing in which.

DESCRIPTION OF THE PREFERRED EMBODIMENTS

Figure 1:
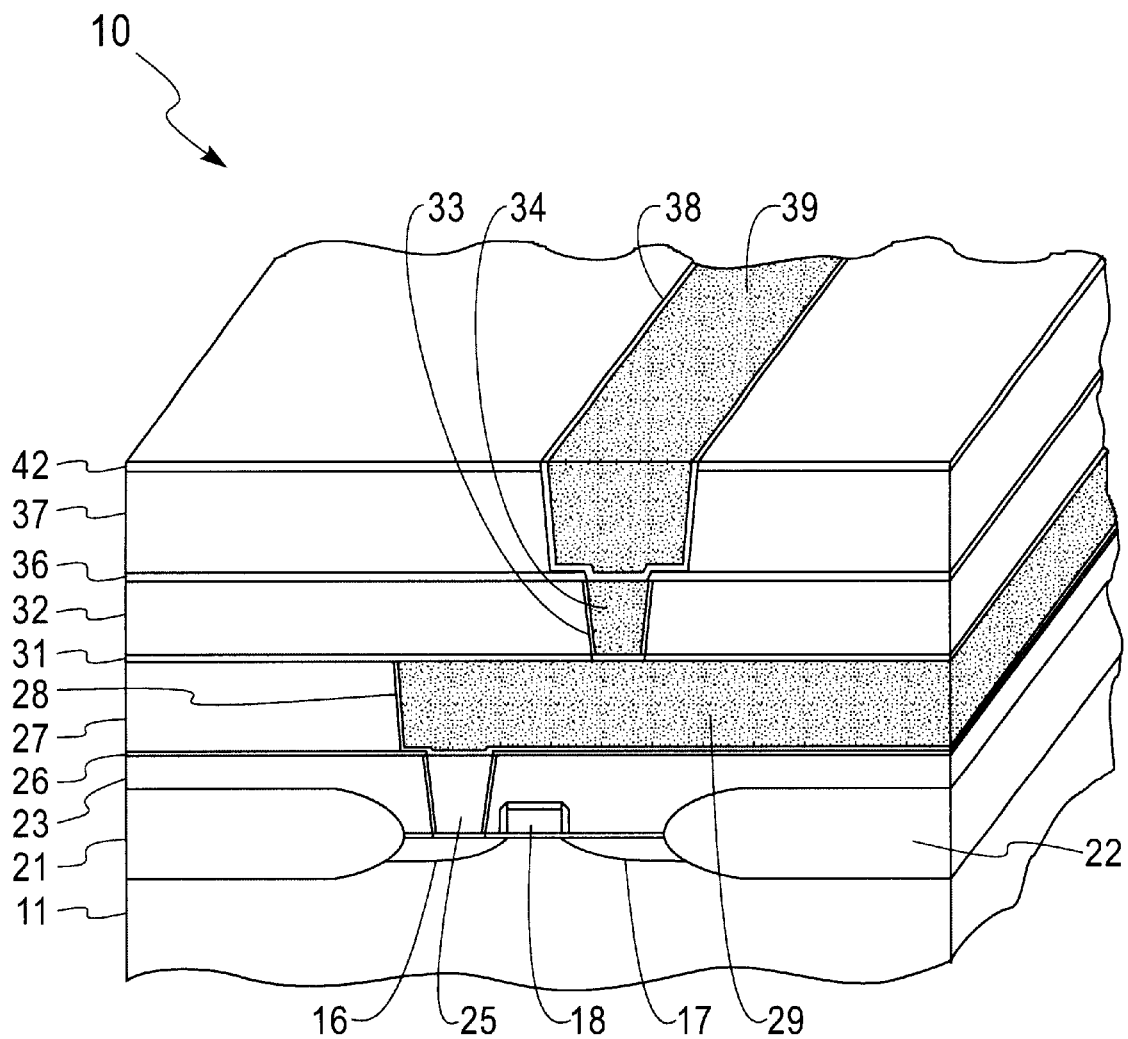
FIG. 1 is a cross section view of one embodiment of the invention.

Referring now to the drawing, FIG. 1 is a cross section view of an example of a Cu Back End of the Line (BEOL) structure on an integrated circuit chip 10 containing Cu lines and vias produced by a single damascene process.

In FIG. 1, integrated circuit chip 10 has a substrate 11 which may be, for example, Si, SiGe, Ge, SOI and GaAs. Substrate 11 may have formed therein, source 16 and drain 17 regions and gate 18 of a typical FET transistor 19. On either side of source 16 and drain 17 regions are recessed oxide regions 21 and 22 on substrate 11. A layer 23 of oxide is formed over oxide regions 21 and 22 and FET transistor 19. A source contact opening is formed layer 23 and filled with metal 25 which is usually tungsten. Layer 23 and metal 25 are planarized by Chemical Mechanical Polishing (CMP). A capping layer 26 of, for example, silicon nitride is formed on the upper surface of layer 23. Layer 27 of dielectric is formed on layer 26 and trenches are formed therein. A liner 28 is formed on the bottom and sidewalls of trenches and then filled with Cu to form lines 29. Layer 27 and lines 29 are planarized by CMP. A capping layer 31 is formed on the upper surface of layer 27 and lines 29. A layer 32 of dielectric is formed on capping layer 31. Via openings are formed in layers 31 and 32 followed by formation of a metal liner 33 and metal such as Cu in the opening to form via 34. Layers 32 and via 34 are planarized by CMP. A capping layer 36 is formed on layers 32 and via 34. A layer 37 of dielectric is formed on capping layer 36. Trenches or openings are formed in layer 37 and capping layer 36. A liner 38 is formed in the trenches in layer 37 and capping layer 36. The trenches are filled with Cu metal to form lines 39. Layer 37 and lines 39 are planarized by CMP. A capping layer 42 is formed on layer 37 and lines 39. Capping layers 26, 31 and 36 are of a different dielectric than the dielectric of layers 23, 27, 32 and 37 which may be silicon oxide, diamond-like-carbon (DLC), fluorinated DLC, poly (arylene ether), SiCOH etc. SiCOH is described in application Ser. No. 09/107567 filed Jun. 29, 1998 now U.S. Patent 6,147,009 which issued Nov. 14, 2000 which is incorporated herein by reference to show one example of a low k (dielectric constant) dielectric. Note that the BEOL is fabricated using a single damascene Cu process, i.e., each Cu layer is individually processed, and the tops of lines 31 and 39 are interfaced with dielectric 8.

Figure 2A:
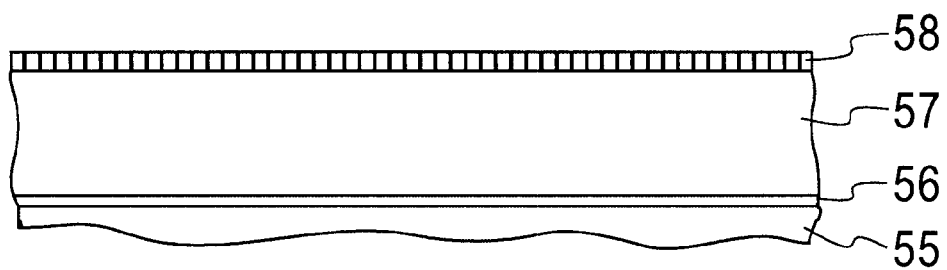
FIGS. 2A–2D are cross section views of stages in the fabrication of a second embodiment of the invention.
Figure 2B:
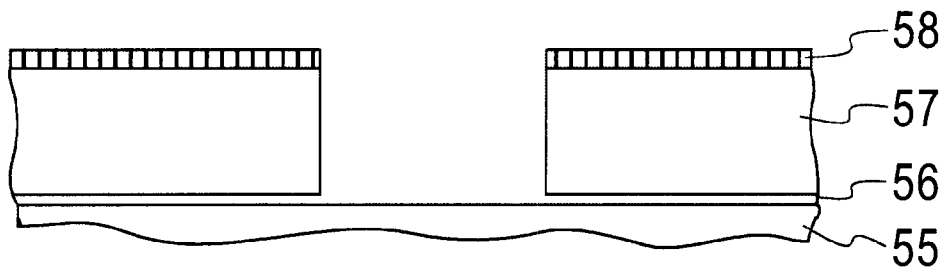
Figure 2C:
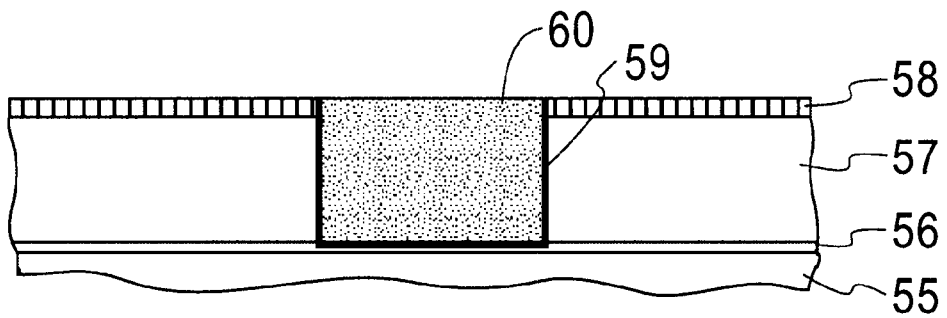
Figure 2D:
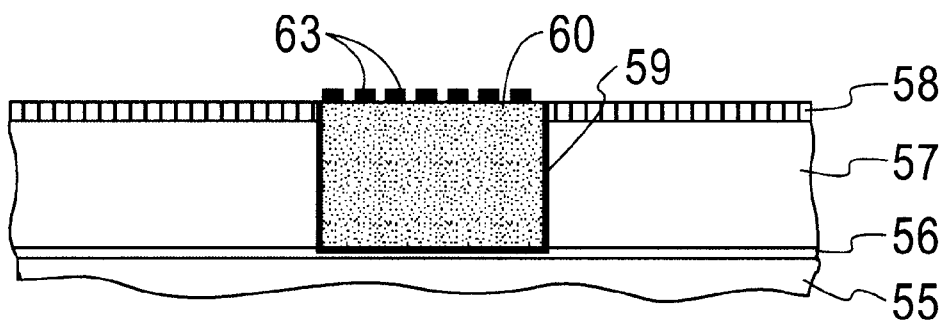
Figure 3A:
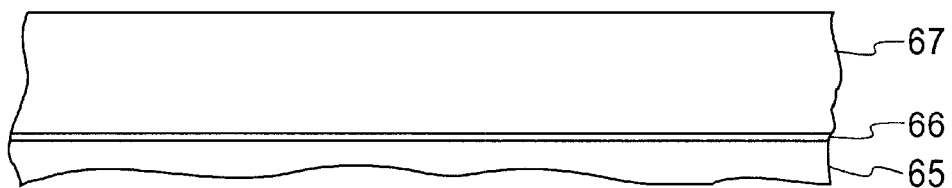
FIGS. 3A–3E are cross section views of stages in fabricating a third embodiment.
Figure 3B:
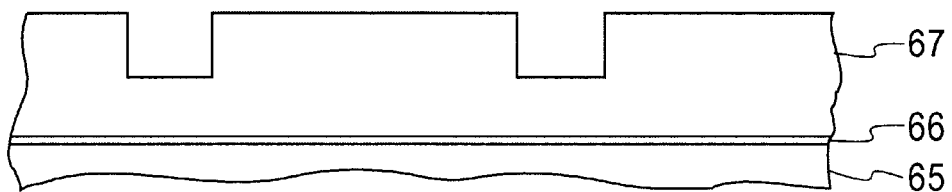
Figure 3C:
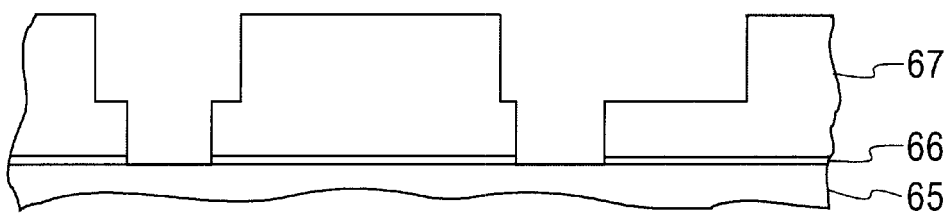
Figure 3D:
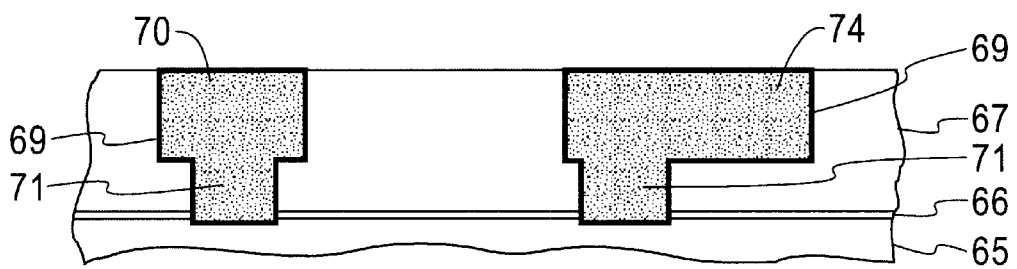
Figure 3E:
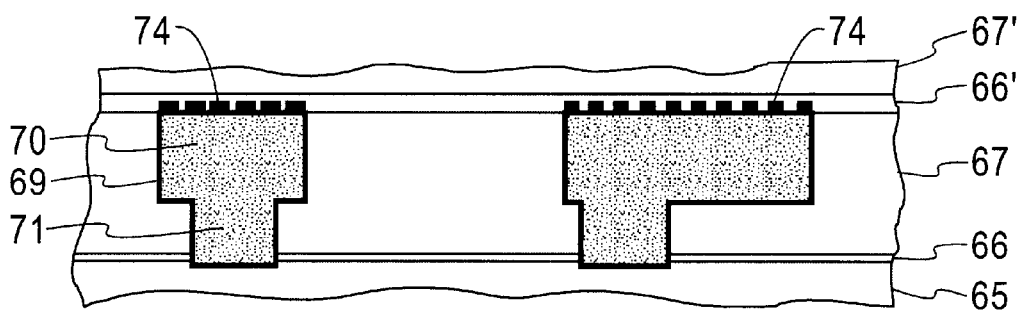

FIGS. 2A–2D shows a process sequence for fabrication of a single damascene Cu line illustrating the selective deposition or formation of a metal capping layer by electroless plating. In the process sequence, dielectric layers 55–57 and 58 are deposited as shown in FIG. 2A. A pattern is transferred by lithographic processing into dielectric layers 56 and 57 as shown in FIG. 2B. Liner metal 59 is then deposited followed by Cu conductor 60 which is thicker than the pattern depth. The excess Cu conductor 60 and the liner 59 are removed by CMP to form a planar surface as shown in FIG. 2C. A thin electroless metal coating 63 is deposited selectively onto the Cu conductor 60 as shown in FIG. 2D. The process shown in FIGS. 2A–2D may be repeated for the next Cu conductor interconnection level.

FIG. 3 is a process sequence for a dual damascene process in which lines and vias of Cu are deposited simultaneously. Starting from planar dielectric layers 65–67 shown in FIG. 3A, the pattern opening for vias 71 are transferred through the dielectric layer 67 as shown in FIG. 3B, then the line or via patterns are transferred as shown in FIG. 3C into layer 67, during which the via etch for vias 71 continue through dielectric layers 66 and 67 to the previously formed Cu line below (not shown). Alternately, the pattern opening for the lines 70 may be transferred first through dielectric layer 67 then the via pattern may be transferred into layer 67 to provide the opening shown in FIG. 3C. The liner metal 69 is then deposited, Cu is deposited into both patterns, usually by electroplating, and planarized by CMP to provide a structure of lines 70 and vias 71 as shown in FIG. 3D. The electroless metal coating 74 is then formed on the top surface of line 70 as shown in FIG. 3E. Continuation of the structure to the next level requires repeating the step of forming planer dielectric layers 66' and 67' shown in FIG. 3E. The electroless coating 74 now separates the Cu surface of line 70 from the planar dielectric 66' formed above. The materials used for layers 23, 27, 32, and 37 may be used for layers 55 and 57 in FIGS. 2A–2D and layers 65 and 67 in FIGS. 3A–3E. The materials used for layers 26, 31, 36 and 42 may be used for layer 56 in FIGS. 2A–2D and layer 66 in FIGS. 3A–3E.

In both the single and dual damascene processes shown in FIGS. 2 and 3, the critical improvement in reliability is afforded by the total encompassing or enclosing of the Cu conductor by metal layers 59, 63, 69 and 74. Present Cu BEOL processing by a major manufacturer provides only three-surface coverage by liner 38 as shown in FIG. 1 and the fourth or top surface of conductor 39 is shown to be in contact with dielectric, usually capping dielectric layer 42 which interface is the source of Cu atomic transport and atomic voiding.

Figure 4:
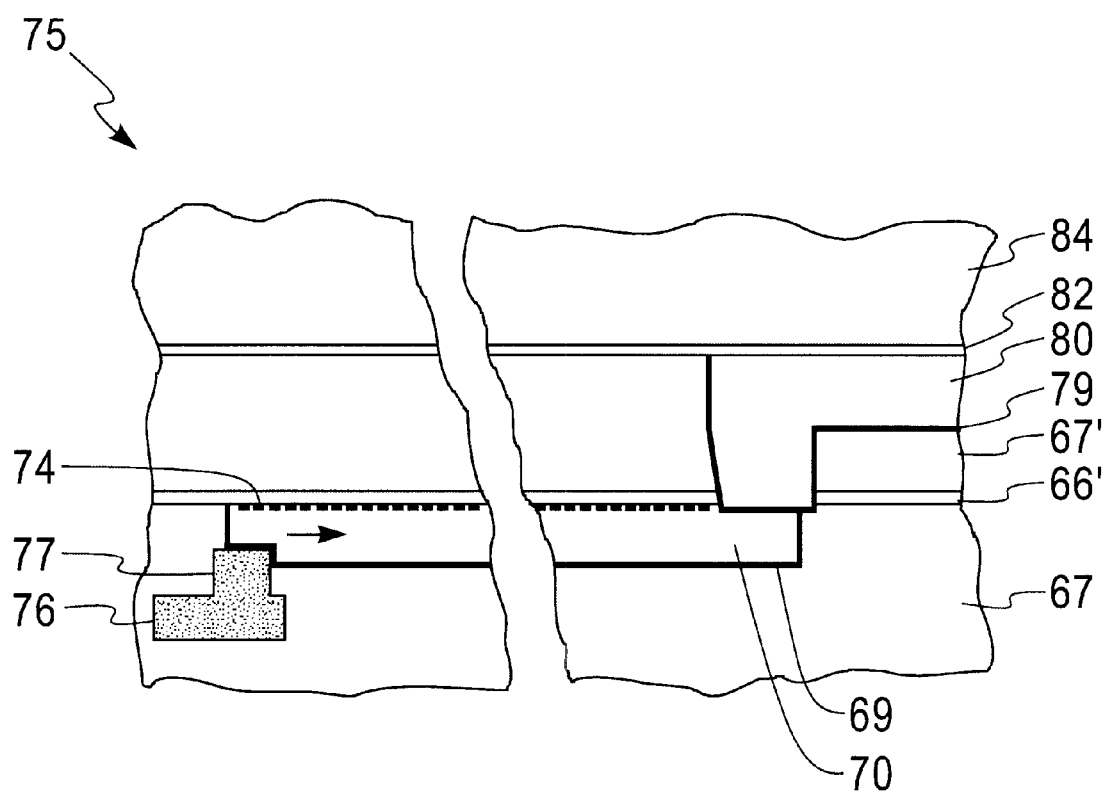
FIG. 4 is a cross section view of a three level electromigration test structure.

The test structure 75 shown in FIG. 4 was used for electromigration lifetime measurements. FIG. 4 shows a cross section view of a three-level damascene interconnection with a SiN$_x$/SiO$_2$ dielectric. A dielectric layer 67 has a lower W line 76 connecting through a W via 77 to the lower surface of liner 69 and a first end of Cu conductor 70. Cu conductor 70 has liner 69 on three surfaces and has a width of 0.28 µm. Cu conductor 70 was electroplated. A second end of Cu conductor 70 is connected through liner 79 to the lower surface of Cu conductor 80. Electron current was passed from W line 76 to Cu conductor 80. The upper surface of Cu conductor 70 and dielectric layer 67 was planarized by CMP. Then a metal film 74 was formed on the upper surface of Cu conductor 70. A dielectric layer 66' of silicon nitride was formed on layer 67 and Cu conductor 70. A dielectric layer 67' was formed above layer 66'. A trench and via was formed in dielectric layer 67' and a liner was formed in trench and via followed by filling with Cu conductor 80. The layer 67' and Cu conductor 80 was planarized by CMP. Cu conductor 80 was chosen to be wide and short to prevent electromigration damage in Cu conductor 80. A layer 82 of silicon nitride was formed on layer 67' and Cu conductor 80. A dielectric layer 84 was formed over layer 82. Test structure 75 was tested for electromigration at 294° C. and at 25 mA/mm$^2$ with various electroless deposited metal coatings 74 and with no coating as shown in FIG. 1.

Figure 5:
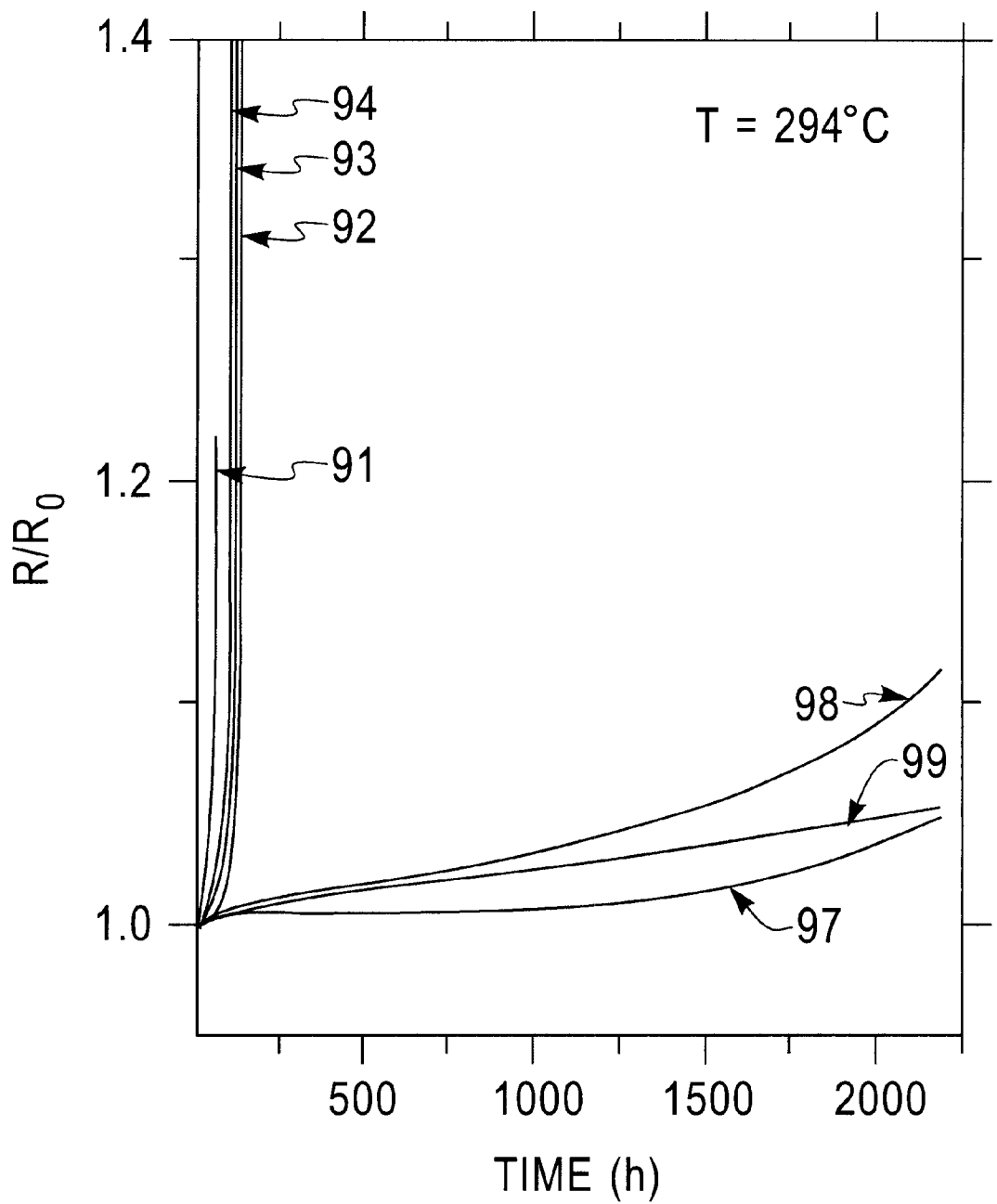
FIG. 5 is a graph showing the ohmic resistance of a Cu conductor and liner in a trench in a dielectric layer with and without a thin metal film on the top surface versus time.

FIG. 5 shows electromigration testing at 294° C. illustrating the superior lifetimes of Cu lines having a metal liner 69 on three sides and coated with metal layers 74 on the top surface of Cu conductor 70. In FIG. 5, the ordinate represents R/R$_0$ and the abscissa represents time in hours. Note that the resistance change as a function of time which monitors rate of migration, has not reached normal failure levels of 1.2 in FIG. 5 representing a 20% change in resistance of coated samples even after 20X the failure time of uncoated Cu lines. FIG. 5 illustrates the significant improvement in electromigration lifetime by metal coating 74. The resistance change in Cu conductor 70 in test structure 75 is monitored as a means of tracking the degree of Cu atomic migration that is occurring, the higher the resistance change over time the more the Cu atomic transport and the lower the Cu conductor lifetime. As is shown in FIG. 5, the resistance increases catastrophically in the uncoated samples shown by curves 91–94 while in all of the coated samples with metal film 74 the resistance change is very slow as shown by curves 97–99. In this test, the normal lifetime was defined as 20% change to its original resistance R$_0$, and was not reached until after at least 2200 hours, whereas the Cu line with no top surface coating has failed within 100 hours. The lowest rate of change is found with coating 74 of CoWP shown by curve 97, but all of the coatings 74 of CoSnP shown by curve 98 and Pd shown by curve 99 provided similarly long lifetimes. It is expected that extrapolation of the improvement to use temperatures 100° C. would give more than two orders of magnitude increase in electromigration and stress migration lifetime, which translates to exceptional flexibility for the circuit designers and effectively removes electromigration as the limiting factor for use current. It was also found with the same set of coated samples that atomic stress voiding was not observed under thermal cycle conditions that produced voiding in the standard uncoated samples. The results of this testing further supports the hypothesis that the uncoated surfaces, or interfaces of Cu with dielectric, are the major sources of electromigration and thus reliability degradation.

While there has been described and illustrated a structure and method for improving the electromigration resistance and reducing the stress induced migration in a Cu conductor by forming a conductive film having metal to metal chemical and metallurgical bonding on and to the upper surface of the Cu conductor, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure comprising:
    a layer of dielectric on a substrate,
    at least one trench formed in said dielectric on said substrate,
    a metal liner formed in said trench,
    a conductor selected from the group consisting of copper and copper alloys on said liner filling said trench,
    a planarized upper surface of said conductor with the upper surface of said layer of dielectric, and
    a conductive film over said upper surface of said conductor only,
    said conductive film having a thickness in the range from 1 to 20 nm and forming a metal to metal chemical and metallurgical bond to provide high electromigration resistance and high resistance to thermal stress voiding and whereby said upper surface of said conductor and said upper surface of said layer of dielectric remain within 20 nm of being co-planar,
    said conductive film selected from the group consisting of CoWP, CoSnP, CoP, CoB, CoSnB, CoWB and In whereby said upper surface of said conductor is protected from oxidation and corrosion.

2. The structure of claim 1 wherein said conductive film has a thickness in the range from 1 to 10 nm.

3. The structure of claim 1 further including an insulating cap dielectric layer over said conductive film on said conductor and said layer of dielectric, said layer of dielectric within 20 nm of being planar.

4. The structure of claim 3 wherein said insulating dielectric cap layer is selected from the group consisting of silicon nitride, silicon oxide, insulating compounds of SICOH having dielectric constants less than 3.2, diamond-like carbon, fluorinated diamond like carbon and poly (Arylene ether).

5. The structure of claim 1 wherein said substrate is selected from the group consisting of silicon, silicon-germanium, SOI, and gallium arsenide.

6. A structure comprising:
    a patterned conductor on a substrate,
    a conductive film over said surface of said conductor only, said conductive film having a thickness in the range from 1 to 20 nm and forming a metal to metal metallurgical bond to provide high electromigration resistance and high resistance to thermal stress voiding,
    said conductive film selected from the group consisting of CoWP, CoSnP, CoP, CoB, CoSnB, CoWB and In whereby said upper surface of said conductor is protected from oxidation and corrosion.

7. The structure of claim 6 wherein said conductive film has a thickness in the range from 1 to 10 nm.

8. The structure of claim 6 further including an insulating cap dielectric layer over said conductive film on said conductor.

9. The structure of claim 8 wherein said insulating dielectric cap layer is selected from the group consisting of silicon nitride, silicon oxide, insulating compounds of SICOH having dielectric constants less than 3.2, diamond-like carbon, fluorinated diamond like carbon and poly (Arylene ether).

10. The structure of claim 6 wherein said conductor is selected from the group consisting of copper and copper alloys.

11. The structure of claim 6 wherein said substrate is selected from the group consisting of silicon, silicon-germanium, SOI, and gallium arsenide.

* * * * *